United States Patent [19]

Feldstein

[11] 4,042,382
[45] Aug. 16, 1977

[54] TEMPERATURE-STABLE NON-MAGNETIC ALLOY

[75] Inventor: Nathan Feldstein, Princeton, N.J.

[73] Assignee: RCA Corporation, New York, N.Y.

[21] Appl. No.: 651,797

[22] Filed: Jan. 23, 1976

Related U.S. Application Data

[62] Division of Ser. No. 531,396, Dec. 10, 1974, Pat. No. 3,953,654, which is a division of Ser. No. 387,601, Aug. 13, 1973, abandoned.

[51] Int. Cl.² .............................................. C22C 19/03
[52] U.S. Cl. ..................................................... 75/170

[58] Field of Search .................. 75/170, 171; 148/32, 148/32.5

[56] References Cited

U.S. PATENT DOCUMENTS 2,200,742  5/1940  Hardy ................................. 75/170

Primary Examiner—R. Dean
Attorney, Agent, or Firm—H. Christoffersen; Birgit E. Morris; Joseph T. Harcarik

[57] ABSTRACT

An alloy composed of nickel, boron and phosphorus that does not change substantially in magnetic properties, hardness or resistivity, with substantial changes in temperature.

1 Claim, 3 Drawing Figures

TEMPERATURE-STABLE NON-MAGNETIC ALLOY

This is a division of application Ser. No. 531,396, filed Dec. 10, 1974, now U.S. Pat. No. 3,953,654 which in turn is a division of now abandoned application Ser. No. 387,601, filed Aug. 13, 1973.

BACKGROUND OF THE INVENTION

One type of magnetic storage medium is known as a magnetic memory disc. In general, this article comprises a substrate disc of non-magnetic material, a thin film of a magnetic material, a surface layer of a hard substance to protect the magnetic film from damage and, often a thin surface film of a lubricant. The substrate material usually used in magnetic memory discs is any of several aluminum alloys. Aluminum is preferred for this purpose because of properties such as lightness, strength and resistance to moderately high temperatures. A suitable alloy is one containing 5.1 – 6.1% zinc, 2.1 – 2.8% magnesium, 1.2 – 2% copper, 0.18 – 0.4% chromium and the balance aluminum.

One type of magnetic film commonly used in magnetic memory discs is composed of a cobalt-phosphorus alloy because of its desirable magnetic properties. The magnetic material should be one that can be deposited as a thin film since thin films are conducive to obtaining high packing density of stored information.

However, it is not feasible to deposit the cobalt alloy directly upon the aluminum alloy substrate because the cobalt alloy must be deposited on a smooth, highly polished surface. The aluminum surface is too rough and cannot be made to take a sufficiently high surface polish for this purpose.

To provide a highly polished surface of non-magnetic material suitable for deposition of the cobalt alloy film, a relatively thick (about one mil) layer of non-magnetic nickel-phosphorus alloy is deposited on the aluminum alloy substrate and this layer is then given a high polish.

The magnetic cobalt alloy film is then deposited on the nickel-phosphorus alloy layer. It is important that the cobalt alloy layer be protected from all surface damage since any surface damage can result in loss of parts of the recorded information.

Layers of various protective materials such as plastics, or metals such as rhodium, have been tried to protect the cobalt alloy layer from surface damage. Rhodium has desirable physical characteristics for this purpose but it is deposited from an acid solution that attacks the cobalt alloy layer. In seeking a better protective material that is not detrimental to the cobalt alloy layer, a layer of cobalt oxides has been proposed. Cobalt oxides are hard enough, adherent enough and otherwise have suitable properties for the intended purpose. However, the layer of cobalt oxides is formed by heating the deposited cobalt alloy layer at a temperature of about 210° – 290° C under controlled humidity conditions. At these temperatures, the underlying non-magnetic nickel-phosphorus layer becomes magnetic and this undesirably affects the magnetic properties of the cobalt alloy layers as a storage medium.

It would be desirable to have an otherwise suitable non-magnetic layer beneath the cobalt alloy layer that does not become magnetic at the temperatures used to form a cobalt oxide layer from cobalt. It would also be desirable to have such a layer that can be deposited by an inexpensive electroless deposition process rather than one requiring a more expensive process such as evaporation or sputtering.

One of the many other uses for electrolessly deposited nickel-phosphorus layers is for resistors in "thin" film hybrid circuits or for resistors in read-only memory matrix applications. Resistors having a rather wide range of resistances can be prepared by this method and the resistors so produced can be made to have small temperature coefficients of resistance depending upon conditions of deposition. However, in the past, it has been found that a heat treatment of these nickel-phosphorus films at temperatures of about 150° to 250° C for from 1 to 15 hours is necessary to stabilize both the resistances and the temperature coefficients of these resistors. It would be desirable to be able to eliminate the need for the heat treatment.

The present invention is based on the discovery that certain alloys of nickel, phosphorus and boron have properties which make these materials especially suitable for the non-magnetic layer beneath the magnetic cobalt layer in a memory disc and also cause these alloys to be particularly attractive for film type resistors in hybrid electronic circuits. Non-magnetic alloys containing about 0.1 to about 0.7 wt. percent boron, about 8–16 wt. percent phosphorus and the balance nickel have been found to remain substantially non-magnetic when heat treated. Alloys containing 0.1 to 0.7 wt. percent boron, 5 to 16 wt. percent phosphorus and the balance nickel have been found to have lower temperature coefficients of resistivity than either alloys containing only nickel and phosphorus or alloys containing only nickel and boron.

THE DRAWING

DESCRIPTION OF PREFERRED EMBODIMENTS

EXAMPLE 1

Figure 1:
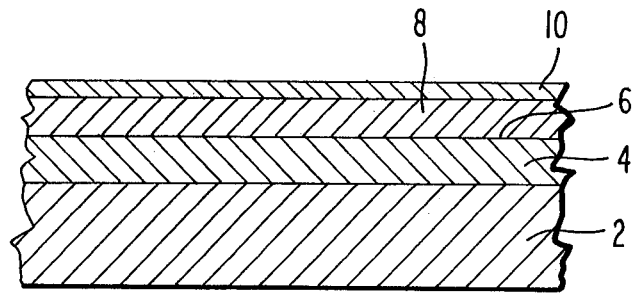
FIG. 1 is a cross section view of part of a magnetic storage element in accordance with the present invention.

A magnetic storage element, in accordance with the present invention, is illustrated in FIG. 1. This storage element may comprise an aluminum alloy substrate disc 2, (a small portion of which is indicated in FIG. 1) a layer 4 of a non-magnetic nickel-phosphorus-boron alloy having a polished upper surface 6, a thin layer of a cobalt-phosphorus alloy 8 and a thin top layer 10 of cobalt oxides.

In order to prepare one side of the aluminum disc 2 to receive the nickel alloy coating 4, that side is cleaned and degreased by treating it with an aqueous solution containing 10% by wt. NaOH and 5% by wt. NaF. This solution is then thoroughly rinsed off and the aluminum surface is treated with an aqueous solution containing 50% by volume concentrated nitric acid. The nitric acid solution is also then rinsed away.

A very thin layer of zinc (not shown) is then deposited on the cleaned aluminum surface by treating the surface with an aqueous solution containing about 455 g/liter of NaOH and about 83 g/liter of ZnO. These two ingredients react to form sodium zincate which is then reduced to zinc.

In order to deposit a coating of nickel-phosphorus-boron alloy on the zinc coating, the article is immersed in a bath having the following composition:

| | |
|---|---|
| Ni++ (from a nickel sulfamate concentrate) | $8.9 \times 10^{-2}$M |
| $NaH_2PO_2 \cdot H_2O$ | $2.35 \times 10^{-1}$M |
| $HCO_2Na$ | 0.5M |
| $(CH_3)_2NHBH_3$ | $4.23 \times 10^{-2}$M |
| pH | 4.0 |
| Temperature | 75° C |

The alloy coating deposited from the above bath is composed of 10.2 wt. % phosphorus, 0.52 wt. % boron and the balance nickel.

A coating 8 of a magnetic cobalt-phosphorus alloy is then deposited on the top surface 6 of the nickel-phosphorus-boron alloy coating 4. This coating may be deposited by immersing the substrate in the following bath:

| | |
|---|---|
| $CoCl_2 \cdot 6H_2O$ | 7.5 g/liter |
| $H_3C_6H_5O_7 \cdot H_2O$ (citric acid) | 19.0 g/liter |
| $NH_4Cl$ | 12.5 g/liter |
| $NaH_2PO_2 \cdot H_2O$ | 10.0 g/liter |
| pH (with NaOH) | 8.2 |

This bath is operated at 80° C.

The cobalt alloy films may be about 5000 A. thick, for example.

To provide a hard protective coating over the cobalt alloy film 8, a surface portion of the film 8 is converted to cobalt oxides by heating in moist air (relative humidity about 60%) at temperatures between about 210° and 290° C. Within this temperature range, the nickel-phosphorus-boron layer 4 remains substantially non-magnetic. In contrast, a nickel-phosphorus alloy layer containing about 10% phosphorus does become magnetic at temperatures of about 290° C and its magnetic properties adversely affect the magnetic properties of an adjacent cobalt-phosphorus layer.

EXAMPLE 2

Figure 2:
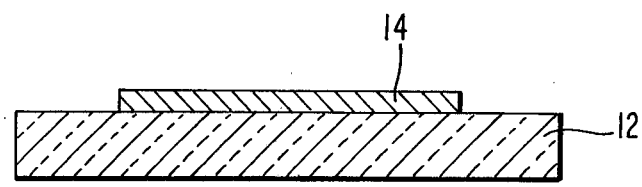
FIG. 2 is a cross section view of a film type resistor in accordance with the invention.

Thin layers of nickel-phosphorus-boron alloys on ceramic or other substrates are also useful as resistors in hybrid microelectronic circuits. An article of this nature is illustrated in FIG. 2 which shows a ceramic substrate plate 12, which may be a high alumina ceramic, for example, on the top surface of which is a film 14 of a nickel-phosphorus-boron alloy. The film 14 comprises a resistor which may be connected into a circuit containing a pattern of conductors and other circuit components (not shown) on the same ceramic substrate.

A preferred method of depositing the film 14 of nickel-phosphorus-boron alloy on the ceramic substrate 12 is electroless deposition. Since ceramic substrates are not catalytic to electroless deposition of metals, the ceramic surface must first be sensitized by treating it with a sensitizer such as a dilute solution of stannous chloride acidified with hydrochloric acid and then activated by treating the sensitized surface with a substance such as a solution of palladium chloride. Both the sensitizing and the activation procedures are conventional in the art.

A coating of nickel-phosphorus-boron alloy may then be deposited on the sensitized and activated surface using the same bath as used in the example above. The thickness of the coating may be about 1500 A. for example. One way to obtain a resistor of defined area is to deposit an overall coating of the alloy and then by depositing a layer of photoresist, exposing and etching (with 50% nitric acid, for example), remove all of the alloy film except the areas desired for the resistor or resistors.

Figure 3:
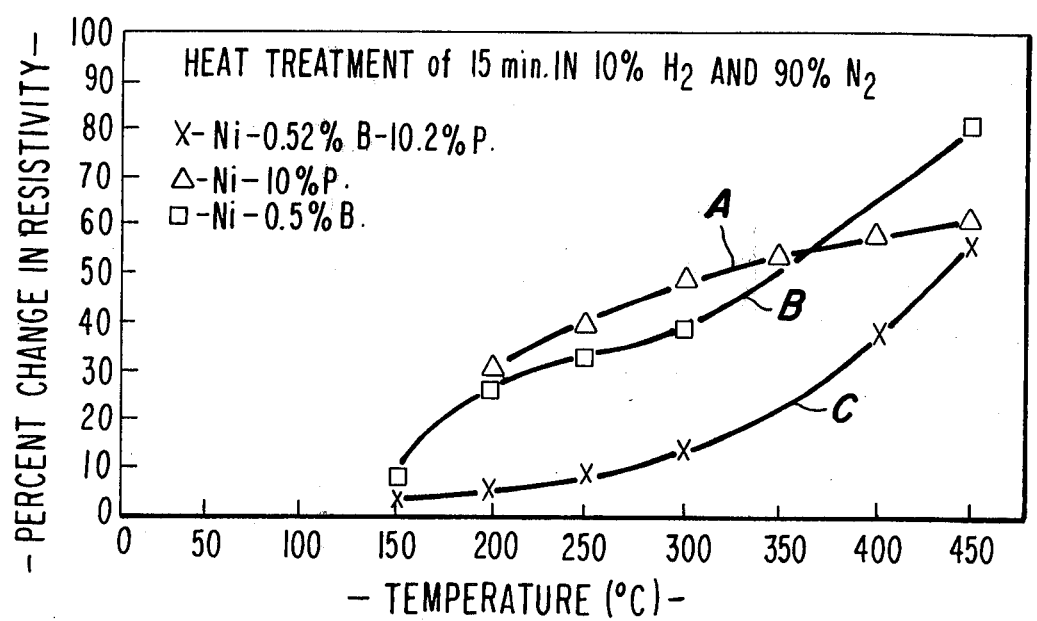
FIG. 3 is a graph comparing percent changes in resistivity versus temperature of an alloy coating of the present invention with certain prior art alloys.

A comparison between a film of a nickel-phosphorus alloy, a film of a nickel-boron alloy and a film of a nickel-phosphorus-boron alloy, with regard to resistivity change with changes in temperature, is shown in the graph of FIG. 3. In this Figure, curve A is for a film consisting of 10% by wt. phosphorus and the balance nickel. Curve B is for a film consisting of 0.5% boron and the balance nickel. Curve C is for a film consisting of 0.52% boron, 10.2% phosphorus and the balance nickel. These were films which had been deposited on ceramic substrates.

The resistivity of each of these films was first measured at ordinary room temperature. The films were then given heat treatments of 15 minutes in an atmosphere comprising 10% hydrogen and 90% nitrogen at a series of temperatures between room temperature and 450° C. The films were permitted to cool after each heat treatment. Resistivities of the cool films were measured after each heat treatment and the percent change in resistivity (in ohms per square) as a function of temperature was plotted for each film. The plotted data indicate that the percent change in resistivity for the nickel-phosphorus-boron film (curve C) was negligible up to a temperature of about 300° C, whereas the percent change in resistivity at 300° C for the other two films was much higher.

The following are examples of how to deposit films of nickel-phosphorus-boron alloys containing various percentages of phosphorus and boron. In all cases the source of the nickel was a sulfamate concentrate. All of these films were heat treated as in Example 2 and all of them had a stable resistivity at temperatures up to about 300° C. Also, all of them showed little or no change in magnetic properties at temperatures up to about 300° C.

| Example 3 | |
|---|---|
| Ni | $8.9 \times 10^{-2}$M |
| $NaH_2PO_2$ | $9.5 \times 10^{-2}$M |
| Dimethylamineborane | $4.2 \times 10^{-2}$M |
| $HCO_2Na$ | $5 \times 10^{-1}$M |
| pH | 5.5 |
| Temperature | 60° C |
| % P | 5.33 |
| % B | 0.45 |

| Example 4 | |
|---|---|
| Ni | $8.9 \times 10^{-2}$M |
| $NaH_2PO_2$ | $1.4 \times 10^{-1}$M |
| Dimethylamineborane | $4.2 \times 10^{-2}$M |
| $HCO_2Na$ | $5 \times 10^{-1}$M |
| pH | 5.0 |
| Temperature | 60.0° C |
| % P | 9.88 |
| % B | 0.47 |

| Example 5 | |
|---|---|
| Ni (as metal) | $8.9 \times 10^{-2}$M (sulfamate) |
| $NaH_2PO_2$ | $1.9 \times 10^{-1}$M |
| Dimethylamineborane | $4.2 \times 10^{-2}$M |
| $HCO_2Na$ | $5 \times 10^{-1}$M |
| pH | 4.5 |
| Temperature | 60.0° C |
| % P | 9.90 |
| % B | 0.19 |

| Example 6 | |
|---|---|
| Ni | $8.9 \times 10^{-2}$M |
| $NaH_2PO_2$ | $2.4 \times 10^{-1}$M |

-continued

| | |
|---|---|
| Dimethylamineborane | $1.3 \times 10^{-2}$M |
| HCO$_2$Na | $5 \times 10^{-1}$M |
| pH | 5.5 |
| Temperature | 60.0° C |
| % P | 6.16 |
| % B | 0.30 |

Example 7

| | |
|---|---|
| Ni | $8.9 \times 10^{-2}$M |
| NaH$_2$PO$_2$ | $2.4 \times 10^{-1}$M |
| Dimethylamineborane | $2.1 \times 10^{-2}$M |
| HCO$_2$Na | $5 \times 10^{-1}$M |
| pH | 5.0 |
| Temperature | 60.0° C |
| % P | 8.05 |
| % B | 0.15 |

Example 8

| | |
|---|---|
| Ni | $8.9 \times 10^{-2}$M |
| NaH$_2$PO$_2$ | $2.4 \times 10^{-1}$M |

-continued

| | |
|---|---|
| Dimethylamineborane | $3.4 \times 10^{-2}$M |
| HCO$_2$Na | $5 \times 10^{-1}$M |
| pH | 4.5 |
| Temperature | 60.0° C |
| % P | 8.59 |
| % B | 0.36 |

Example 9

| | |
|---|---|
| Ni | $8.9 \times 10^{-2}$M |
| NaH$_2$PO$_2$ | $2.4 \times 10^{-2}$M |
| Dimethylamineborane | $4.2 \times 10^{-2}$M |
| HCO$_2$Na | $5 \times 10^{-1}$M |
| pH | 4.0 |
| Temperature | 60.0° C |
| % P | 9.04 |
| % B | 0.20 |

I claim:
1. An alloy consisting essentially of 5 – 16 wt. % phosphorus, 0.1 to 0.7 wt. % boron and the balance nickel.

* * * * *